(12) United States Patent
Du et al.

(10) Patent No.: US 11,199,923 B2
(45) Date of Patent: Dec. 14, 2021

(54) TOUCH DISPLAY MODULE AND TOUCH DISPLAY SCREEN

(71) Applicant: Truly (Huizhou) Smart Display Limited, Guangdong (CN)

(72) Inventors: Maohua Du, Guangdong (CN); Jinzhao Luo, Guangdong (CN); Junwen Hu, Guangdong (CN)

(*) Notice: Subject to any disclaimer, the term of this patent is extended or adjusted under 35 U.S.C. 154(b) by 0 days.

(21) Appl. No.: 17/259,963

(22) PCT Filed: Oct. 31, 2019

(86) PCT No.: PCT/CN2019/114637
§ 371 (c)(1),
(2) Date: Jan. 13, 2021

(87) PCT Pub. No.: WO2020/177356
PCT Pub. Date: Sep. 10, 2020

(65) Prior Publication Data
US 2021/0294445 A1  Sep. 23, 2021

(30) Foreign Application Priority Data

Mar. 1, 2019  (CN) .......................... 201910156167.X

(51) Int. Cl.
*G06F 3/041* (2006.01)
*G06F 3/044* (2006.01)
*H01L 27/32* (2006.01)

(52) U.S. Cl.
CPC .......... *G06F 3/0412* (2013.01); *G06F 3/0443* (2019.05); *H01L 27/323* (2013.01); *H01L 27/3218* (2013.01); *H01L 27/3246* (2013.01)

(58) Field of Classification Search
None
See application file for complete search history.

(56) References Cited

U.S. PATENT DOCUMENTS 10,700,143 B2 * 6/2020 Wang .................... H01L 27/323

FOREIGN PATENT DOCUMENTS

CN 111625130 A * 9/2020 ............ G06F 3/041

\* cited by examiner

*Primary Examiner* — Duane N Taylor, Jr.
(74) *Attorney, Agent, or Firm* — Prakash Nama; Global IP Services, PLLC

(57) ABSTRACT

The present application relates to a touch display module (10) and a touch display screen. The touch display module (10) comprises a first substrate (100), a second substrate (200), a touch electrode layer (300), a pixel definition layer (400) and a cathode layer (500), a plurality of support portions (600) being provided between the cathode layer (500) and the pixel definition layer (400), and the projection of each support portion (600) on the touch electrode layer (300) being located in a light transmitting hole (310). The light transmitting hole (310) corresponds to a pixel unit (410) and the support portion (600) respectively, so that a distance between a part of the cathode layer (500) on the support portion (600) and the touch electrode layer (300) includes the pixel unit (410), so as to increase the distance between a part of the cathode layer (500) on the support portion (600) and the touch electrode layer (300), thereby reducing coupling capacitance between the touch electrode and the cathode layer (500), and improving the effect of touch sensing.

20 Claims, 3 Drawing Sheets

TOUCH DISPLAY MODULE AND TOUCH DISPLAY SCREEN

BACKGROUND OF THE INVENTION

This application claims priority to Chinese Patent Application No. 201910156167.X, filed with the China National Intellectual Property Administration (CNIPA) on Mar. 1, 2019 and entitled "TOUCH DISPLAY MODULE AND TOUCH DISPLAY SCREEN", which is hereby incorporated herein by reference in its entirety.

The present application relates to the technical field of touch display, and in particular, to a touch display module and a touch display screen.

With the rapid development of the touch display technology, touch display can control the equipment conveniently and quickly, which is more and more popular, especially in mobile phones, computers and various devices with display interface control. In the traditional embedded touch display module, single sub-pixel and single photo spacer are hollowed out respectively, that is, metal of the touch electrode in the non-hollow area surrounds the photo spacer, and cathode metal is arranged on the surface of the photo spacer, so that the coupling capacitance between the touch electrode and the cathode is large, thereby affecting the touch performance.

BRIEF SUMMARY OF THE INVENTION

According to various embodiments of the present application, a touch display module and a touch display screen are provided.

A touch display module includes:

a first substrate, a second substrate, a touch electrode layer, a pixel defining layer and a cathode layer;

the first substrate and the second substrate are spaced, the touch electrode layer is arranged on one side, close to the second substrate, of the first substrate, and the touch electrode layer is provided with at least one light hole;

the pixel defining layer is arranged on one side, close to the first substrate, of the second substrate, the pixel defining layer is provided with pixel units in one-to-one correspondence to the light holes, and a projection of each pixel unit on the touch electrode layer falls within the corresponding light hole; and the cathode layer is arranged on one side, deviating from the second substrate, of the pixel defining layer, the cathode layer and the touch electrode layer are spaced, a plurality of photo spacers are arranged between the cathode layer and the pixel defining layer, a projection of each photo spacer on the touch electrode layer falls within one light hole, and a part of the cathode layer corresponding to each photo spacer passes through the light hole and abuts against the first substrate.

A touch display screen includes the touch display module.

Details of one or more embodiments of the present application are set forth in the following drawings and description. Other features, objectives and advantages of the present application will become apparent from the description, drawings and claims.

BRIEF DESCRIPTION OF THE DRAWINGS

To better describe and illustrate the embodiments and/or examples of those applications disclosed herein, one or more accompanying drawings may be referred. Additional details or examples for describing the accompanying drawings should not be considered as a limitation to the scope of any one of the disclosed applications, the currently described embodiments and/examples and the currently understood best mode of these applications.

DETAILED DESCRIPTION OF THE INVENTION

Figure 1:
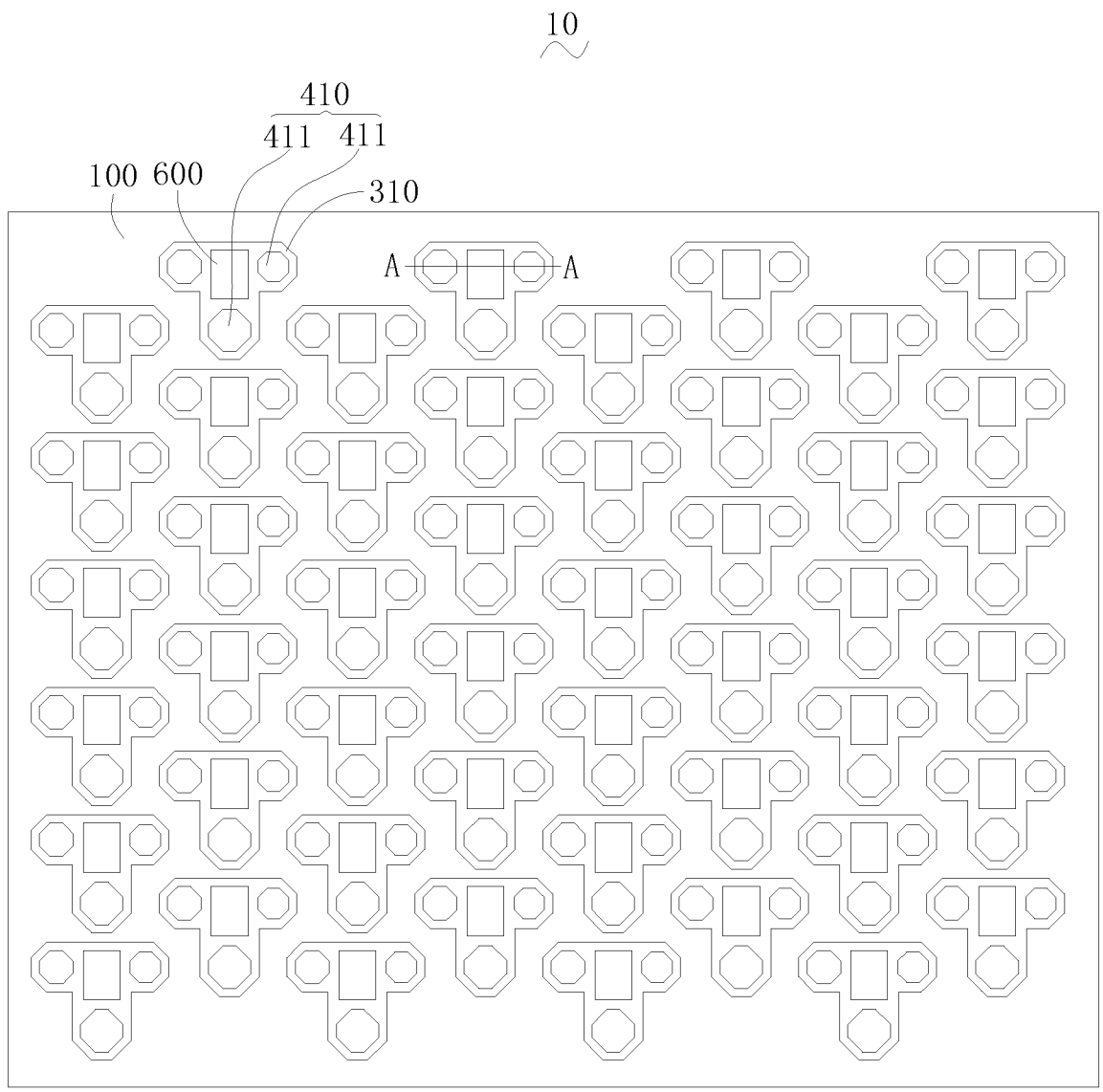
FIG. 1 is a structural schematic diagram of a touch display module of an embodiment.

In order to facilitate the understanding of the present application, the present application will be described more comprehensively below with reference to the relevant drawings. Preferred embodiments of the present application are given in the accompanying drawings. However, the present application may be implemented in many different forms and is not limited to the embodiments described herein. On the contrary, these embodiments are provided, so that the disclosure of the present application will be understood more thoroughly and comprehensively.

It should be noted that when an component is referred to as being "fixed" to another component, the component may be directly arranged on another component or a central component may be present. When one component is considered as being "connected" to another component, the component may be directly connected to another component or a central component may be present at the same time.

Unless otherwise defined, all technical and scientific terms used herein have the same meanings as those commonly understood by those skilled in the technical field of the present application. The terms used herein in the description of the present application are merely for the purpose of describing specific embodiments, and is not intended to limit the present application.

In one embodiment, a touch display module includes: a first substrate, a second substrate, a touch electrode layer, a pixel defining layer and a cathode layer; the first substrate and the second substrate are spaced, the touch electrode layer is arranged on one side, close to the second substrate, of the first substrate, and the touch electrode layer is provided with at least one light hole; the pixel defining layer is arranged on one side, close to the first substrate, of the second substrate, the pixel defining layer is provided with pixel units in one-to-one correspondence to the light holes, and a projection of each pixel unit on the touch electrode layer falls within the corresponding light hole; and the cathode layer is arranged on one side, deviating from the second substrate, of the pixel defining layer, the cathode layer and the touch electrode layer are spaced, a plurality of photo spacers are arranged between the cathode layer and the pixel defining layer, a projection of each photo spacer on the touch electrode layer falls within one light hole, and a part of the cathode layer corresponding to each photo spacer passes through the light hole and abuts against the first substrate. In the above touch display module, the light holes are formed at the hollowed positions of the touch electrode layer, the light holes correspond to the pixel units and the photo spacers respectively, that is the pixel units are in one-to-one correspondence to the light holes and the photo spacers correspond to the light holes similarly, part of the cathode layer on the photo spacers abut against the first substrate through the light holes, and a distance between part of the cathode layer on the photo spacers and the touch electrode layer includes the pixel unit, so that the distance between part of the cathode layer on the photo spacers and the touch electrode layer is increased, thereby reducing the coupling capacitance between the touch electrode and the cathode layer and improving the touch induction effect.

Referring to FIG. 1, it is a structural schematic diagram of a touch display module of an embodiment of the present invention.

Figure 2:
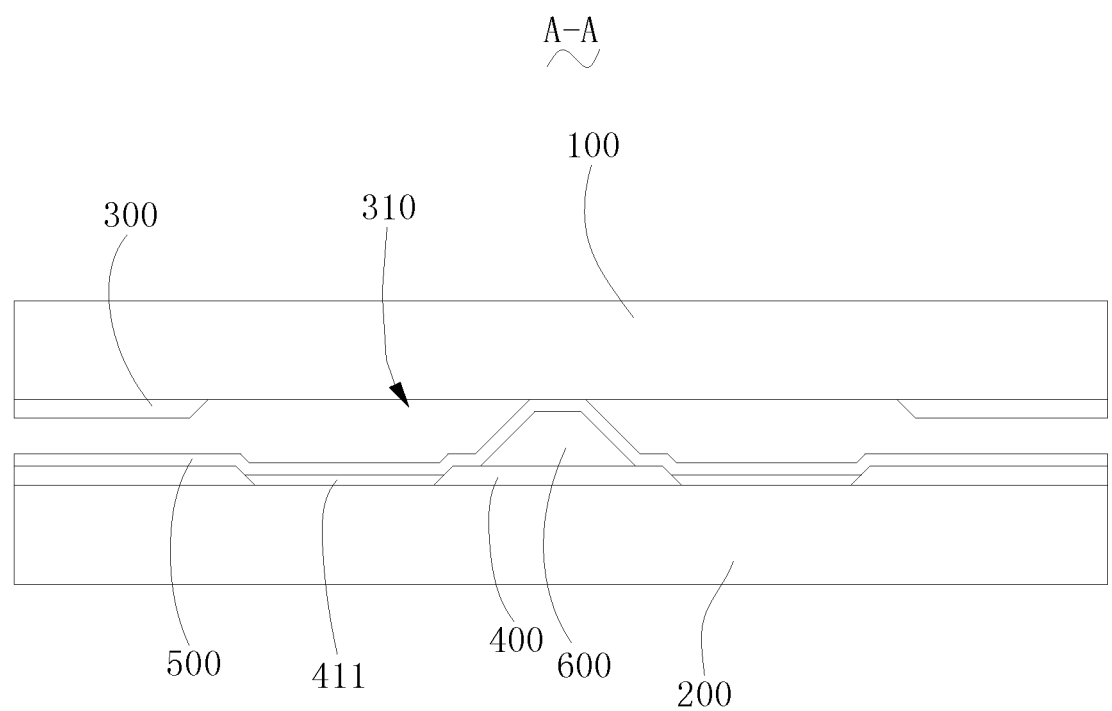
FIG. 2 is a cross-sectional view taken along a line A-A of FIG. 1.

Referring to FIG. 1 and FIG. 2, a touch display module 10 includes: a first substrate 100, a second substrate 200, a touch electrode layer 300, a pixel defining layer 400 and a cathode layer 500; the first substrate 100 and the second substrate 200 are spaced, the touch electrode layer 300 is arranged on one side, close to the second substrate 200, of the first substrate 100, and the touch electrode layer 300 is provided with at least one light hole 310; the pixel defining layer 400 is arranged on one side, close to the first substrate 100, of the second substrate 200, the pixel defining layer 400 is provided with pixel units 410 in one-to-one correspondence to the light holes 310, and a projection of each pixel unit 410 on the touch electrode layer 300 falls within the corresponding light hole 310; and the cathode layer 500 is arranged on one side, deviating from the second substrate 200, of the pixel defining layer 400, the cathode layer 500 and the touch electrode layer 300 are spaced, a plurality of photo spacers 600 are arranged between the cathode layer 500 and the pixel defining layer 400, a projection of each photo spacer 600 on the touch electrode layer 300 falls within one light hole 310, and a part of the cathode layer 500 corresponding to each photo spacer 600 passes through the light hole 310 and abuts against the first substrate 100.

Specifically, the pixel defining layer is provided with a plurality of pixel holes, and one pixel unit is arranged in each pixel hole.

In one embodiment, the touch electrode layer 300 and the cathode layer 500 are arranged oppositely, and a distance between the touch electrode layer 300 and the cathode layer 500 is controlled within a certain distance range, thereby reducing coupling capacitance generated by too close distance between the touch electrode layer 300 and the cathode layer 500 when the first substrate 100 is extruded. The touch electrode layer 300 is connected to the first substrate 100, that is, the touch electrode layer 300 is formed on the first substrate 100, and the first substrate 100 is a color filter.

In one embodiment, the pixel defining layer 400 is formed on the second substrate 200, the pixel defining layer 400 is provided with pixel units 410 in one-to-one correspondence to the light holes 310, the pixel units 410 emit various colors of light, and different colors of pixel point light is output by adjusting the intensity of the light of the pixel units 410. The second substrate 200 is provided with a display driving circuit, that is, the second substrate 200 is configured to control the output light of the pixel units 410, for example, the second substrate 200 includes thin film transistor (TFT) glass, and the output states of the pixel units are controlled by a thin film transistor carried on the second substrate 200, so that the output image of the touch display module is controlled.

In one embodiment, each pixel unit includes a plurality of organic light-emitting diode (OLED) pixels.

In one embodiment, referring to FIG. 1 and FIG. 2, each pixel unit 410 is arranged adjacent to one photo spacer 600. The photo spacer 600 is arranged close to the pixel unit 410, that is, the photo spacer 600 and the pixel unit 410 are jointly arranged in an area, and a projection of the area where the photo spacer 600 and the pixel unit 410 are located on the touch electrode layer 300 falls within the corresponding light hole 310. Each photo spacer 600 corresponds to one pixel unit 410, that is, the photo spacers 600 are in one-to-one correspondence to the pixel units 410, and each light hole 310 corresponds to one photo spacer 600 and one pixel unit 410, so that light emitted by each pixel unit 410 passes through the light hole 310, the photo spacer 600 adjacent to the pixel unit 410 passes through the light hole 310 and abuts against the first substrate 100, one photo spacer 600 is arranged near each pixel unit 410 and corresponds to one light hole 310, and a distance between the first substrate 100 and the second substrate 200 corresponding to each light hole 310 is unchanged, thus avoiding uneven display caused by deformation of the first substrate under the action of an external force.

In one embodiment, referring to FIG. 1 and FIG. 2, each pixel unit 410 includes a plurality of sub-pixels 411, and the plurality of sub-pixels 411 surround the photo spacer 600. The plurality of sub-pixels 411 jointly form a pixel unit 410. In the embodiment, each pixel unit 410 includes three sub-pixels 411. Specifically, the pixel unit 410 includes a red pixel, a green pixel and a blue pixel. The three sub-pixels 411 are arranged around the photo spacer 600 respectively, that is, the three sub-pixels 411 surround one photo spacer 600, that is, the sub-pixels 411 increase the distance between the photo spacer 600 and the touch electrode layer 300, so that the distance between the cathode layer 500 covering the photo spacer 600 and the touch electrode layer 300 is increased, thereby reducing the coupling capacitance between the touch electrode and the cathode layer 500 and improving the touch induction effect.

In one embodiment, referring to FIG. 1 and FIG. 2, the photo spacer 600 and at least one sub-pixel 411 are located in a straight line. The cathode layer 500 covering the photo spacer 600 corresponds to the light hole 310, the touch electrode layer 300 is on the edge of the light hole 310, and the sub-pixel 411 and the photo spacer 600 are in a straight line, so that the touch electrode layer 300 on the edge of the light hole 310 and the cathode layer 500 on the photo spacer 600 are spaced by a distance of at least one sub-pixel 411, and the distance between the cathode layer 500 on the photo spacer 600 and the touch electrode layer 300 is increased, thereby reducing the coupling capacitance between the touch electrode and the cathode layer 500 and improving the touch induction effect.

In one embodiment, the pixel unit includes three sub-pixels, and the three sub-pixels are sequentially arranged and located on one side of the photo spacer, so that a distance between the side of the photo spacer and the touch electrode layer is a distance of the three sub-pixels.

In one embodiment, the pixel unit includes three sub-pixels, one sub-pixel is arranged on one side of the photo spacer, two sub-pixels are arranged on the other side of the photo spacer, and the three sub-pixels and the photo spacer are located on the same straight line, so that a distance between one side of the photo spacer and the touch electrode layer is a distance of one sub-pixel, and a distance between the other side of the photo spacer and the touch electrode layer is a distance of two sub-pixels, thereby reducing the coupling capacitance between the touch electrode and the cathode layer and improving the touch induction effect.

In one embodiment, the pixel unit includes three sub-pixels, one sub-pixel is arranged on one side of the photo spacer, two sub-pixels are arranged on the other side of the photo spacer, and the three sub-pixels and the photo spacer are of an L-shaped structure.

In one embodiment, referring to FIG. 1 and FIG. 2, the pixel unit 410 includes three sub-pixels 411, the three sub-pixels 411 are located on the edge of the photo spacer 600 respectively, that is, the three sub-pixels 411 are arranged on the edge of the photo spacer 600 to divide the edge of the photo spacer 600, so that the photo spacer 600 is located among three photo spacers 600, that is, the three sub-pixels 411 surround the photo spacer 600, so that a distance between the edge of the photo spacer 600 and the touch electrode layer 300 is a distance of one sub-pixel 411, thereby reducing the coupling capacitance between the touch electrode and the cathode layer 500 and improving the touch induction effect.

In one embodiment, the pixel unit 410 includes three sub-pixels 411, the three sub-pixels 411 are symmetrically arranged on the edge of the photo spacer 600, for example, the three sub-pixels 411 are axially symmetrical, that is, the photo spacer 600 and the three sub-pixels 411 are of a T-shaped structure, that is the photo spacer 600 is located on a central axis, the three sub-pixels 411 are located on a vertex of the T-shaped structure respectively, so that distribution of the sub-pixels 411 around the photo spacer 600 is optimized, and a distance between each of at least three sides of the photo spacer 600 and the touch electrode layer 300 is a distance of one sub-pixel 411, thereby reducing the coupling capacitance between the touch electrode and the cathode layer 500 and improving the touch induction effect.

In one embodiment, referring to FIG. 1 and FIG. 2, the light hole 310 has a T-shaped structure. The pixel unit 410 includes three sub-pixels 411, the photo spacer 600 and the three sub-pixels 411 are of a T-shaped structure, and a shape formed by the photo spacer 600 and the pixel unit 410 is matched with a shape of the light hole 310, that is, the shape of the light hole 310 is as same as the shape formed by the photo spacer 600 and the pixel unit 410 and the edge of the light hole 310 is matched with the edge of the shape formed by the photo spacer 600 and the pixel unit 410, that is, an edge of a projection of the shape formed by the photo spacer 600 and the pixel unit 410 on the touch electrode layer 300 coincides with the edge of the light hole 310, so that light emitted by the three sub-pixels 411 is ensured to pass through the light hole 310, the distance between the cathode layer 500 on the photo spacer 600 and the touch electrode layer 300 is increased, that is, the distance between the cathode layer 500 on the photo spacer 600 and the touch electrode layer 300 is increased without affecting light output of the pixel unit 410, so that the distance between the cathode layer 500 on the photo spacer 600 and the touch electrode layer 300 near the light hole 310 is increased, thereby reducing the coupling capacitance between the touch electrode and the cathode layer 500 and improving the touch induction effect.

Figure 3:
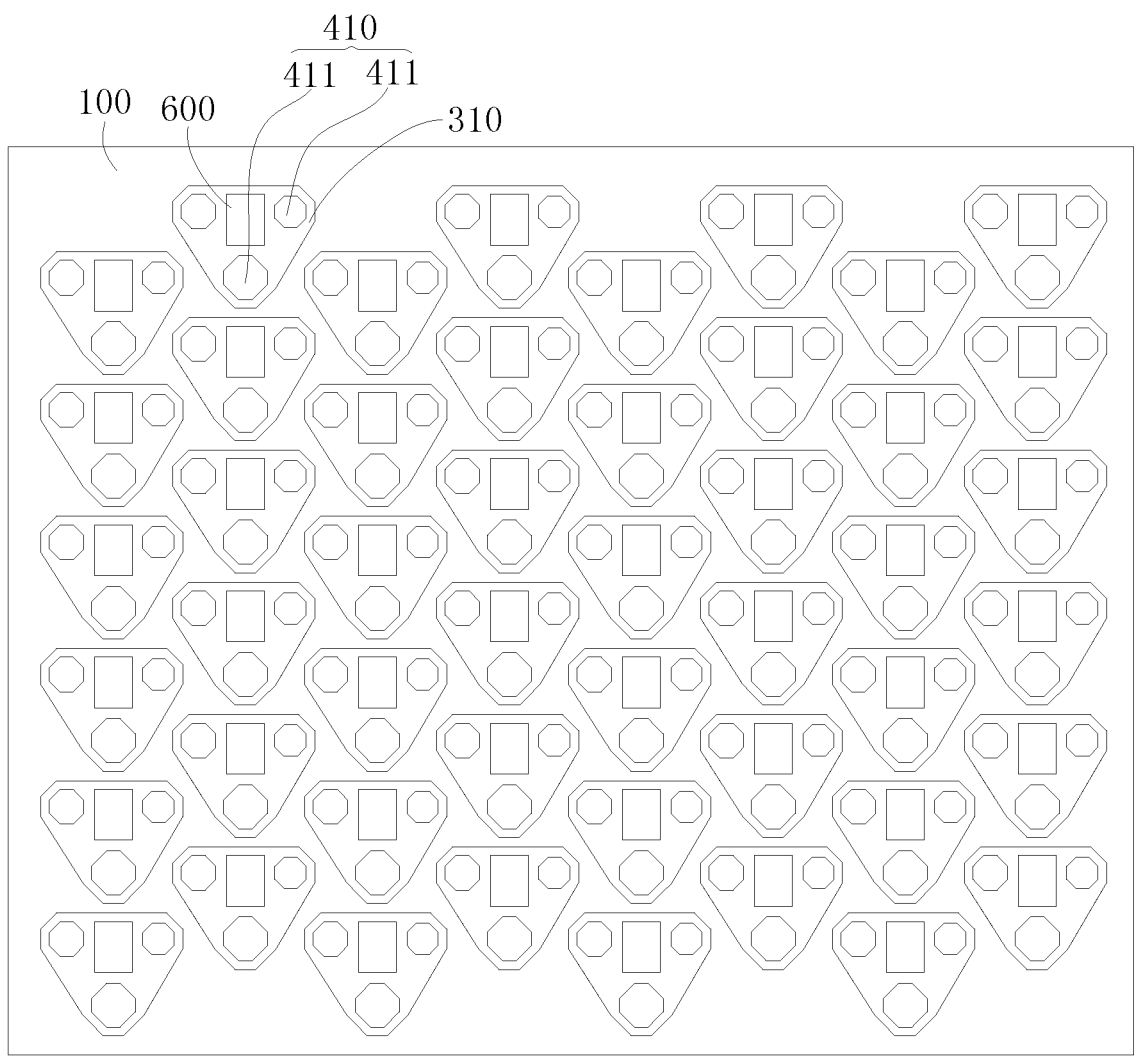
FIG. 3 is a structural schematic diagram of a touch display module of another embodiment.

In one embodiment, referring to FIG. 2 and FIG. 3, the light hole 310 has a triangular structure. The pixel unit 410 includes three sub-pixels 411, and the photo spacer 600 and the three sub-pixels 411 are of T-shaped structure. A shape formed by the pixel unit 410 and the photo spacer 600 falls in the light hole 310, that is, projections of the pixel unit 410 and the photo spacer 600 on the touch electrode layer 300 fall within the light hole 310, that is, in a direction vertical to the touch electrode layer 300, the pixel unit 410 and the photo spacer 600 are completely located in the light hole 310. In this way, one sub-pixel 411 is present between the touch electrode layer 300 corresponding to three sides of the light hole 310 and the cathode layer 500 on the photo spacer 600, so that the distance between the cathode layer 500 on the photo spacer 600 and the touch electrode layer 300 near the light hole 310 is increased, thereby reducing the coupling capacitance between the touch electrode and the cathode layer 500 and improving the touch induction effect. A shape of the light hole 310 may be a rectangle, a circle and other structures as long as the projections of the photo spacer 600 and the pixel unit 410 on the touch electrode layer 300 fall within the corresponding light hole 310. The light holes 310 with other shapes have the same function, which is not elaborated herein.

In one embodiment, referring to FIG. 1 and FIG. 2, a material of the cathode layer 500 includes a metal film. Since the pixel defining layer 400 is covered with the cathode layer 500, the cathode layer 500 covers the pixel unit 410, that is, the cathode layer 500 covers the sub-pixel 411. The cathode layer 500 adopts a metal film. According to the characteristic that the metal film has small thickness, for example, a thickness of the cathode layer 500 is 10 nm to 100 nm; for another example, the thickness of the cathode layer 500 is 15 nm to 50 nm; and for another example, the thickness of the cathode layer 500 is 20 nm. In this way, since the cathode layer 500 is thin and made of a metal material, and the metal film may facilitate light transmission while serving as the cathode layer 500, so that light emitted by the sub-pixel 411 passes through the cathode layer 500, thus realizing light output of the sub-pixel 411, that is, realizing light of the pixel unit 410. The metal film is formed on the pixel defining layer 400 by an evaporation process.

In one embodiment, a material of the cathode layer is magnesium silver alloy, the cathode layer is one layer of magnesium silver metal film, light emitted by the pixel unit passes through the magnesium silver metal film, and due to the low resistance of the magnesium silver metal film, the magnesium silver metal film, serving as the cathode layer, has high electric conductivity. As for the metal film made of other metal materials, as long as the light of the pixel unit can pass through the metal film and the metal film can serve as the cathode layer with high electric conductivity, the metal film will not be elaborated.

The present invention further provides a touch display screen, including the touch display module described in any one of the above embodiments. In the touch display screen, the light holes are formed at the hollowed positions of the touch electrode layer, the light holes correspond to the pixel units and the photo spacers respectively, that is the pixel units are in one-to-one correspondence to the light holes and the photo spacers correspond to the light holes similarly, part of the cathode layer on the photo spacers abut against the first substrate through the light holes, and a distance between part of the cathode layer on the photo spacers and the touch electrode layer includes the pixel unit, so that the distance between part of the cathode layer on the photo spacers and the touch electrode layer is increased, thereby reducing the coupling capacitance between the touch electrode and the cathode layer and improving the touch induction effect.

The technical features of the above embodiments may be arbitrarily combined. For brevity of description, all possible combinations of the technical features in the above embodiments are not described. However, as long as there is no contradiction between the combinations of these technical features, all these combinations should be considered as the scope of this specification.

The above embodiments only express several implementation manners of the present application, and the description thereof is more specific and detailed, but is not to be construed as a limitation to the patentable scope of the present application. It should be pointed out that several variations and improvements can be made by those of ordinary skill in the art without departing from the conception of the present invention, but such variations and improvements should fall within the protection scope of the present application. Therefore, the protection scope of the patent of the present application should be subject to the appended claims.

What is claimed is:

1. A touch display module, comprising a first substrate, a second substrate, a touch electrode layer, a pixel defining layer and a cathode layer, wherein
the first substrate and the second substrate are spaced, the touch electrode layer is arranged on one side, close to the second substrate, of the first substrate, and the touch electrode layer is provided with at least one light hole;
the pixel defining layer is arranged on one side, close to the first substrate, of the second substrate, the pixel defining layer is provided with pixel units in one-to-one correspondence to the light holes, and a projection of each pixel unit on the touch electrode layer falls within the corresponding light hole; and
the cathode layer is arranged on one side, deviating from the second substrate, of the pixel defining layer, the cathode layer and the touch electrode layer are spaced, a plurality of photo spacers are arranged between the cathode layer and the pixel defining layer, a projection of each photo spacer on the touch electrode layer falls within one light hole, and a part of the cathode layer corresponding to each photo spacer passes through the light hole and abuts against the first substrate.

2. The touch display module according to claim 1, wherein each pixel unit is arranged adjacent to one photo spacer.

3. The touch display module according to claim 1, wherein the pixel unit comprises a plurality of sub-pixels, and the plurality of sub-pixels surrounds the photo spacer.

4. The touch display module according to claim 3, wherein the photo spacer and at least one sub-pixel are located on a straight line.

5. The touch display module according to claim 3, wherein the pixel unit comprises three sub-pixels, and the three sub-pixels are located on the edge of the photo spacer respectively.

6. The touch display module according to claim 3, wherein the pixel defining layer is provided with a plurality of pixel holes, and one sub-pixel is arranged in each pixel hole.

7. The touch display module according to claim 1, wherein a material of the cathode layer comprises a metal film.

8. The battery module according to claim 1, wherein a material of the cathode layer comprises magnesium silver alloy.

9. The touch display module according to claim 1, wherein the light hole has a T-shaped structure.

10. The touch display module according to claim 1, wherein the light hole has a triangular structure.

11. A touch display screen, comprising a touch display module, wherein the touch display module comprises a first substrate, a second substrate, a touch electrode layer, a pixel defining layer and a cathode layer;
the first substrate and the second substrate are spaced, the touch electrode layer is arranged on one side, close to the second substrate, of the first substrate, and the touch electrode layer is provided with at least one light hole;
the pixel defining layer is arranged on one side, close to the first substrate, of the second substrate, the pixel defining layer is provided with pixel units in one-to-one correspondence to the light holes, and a projection of each pixel unit on the touch electrode layer falls within the corresponding light hole; and
the cathode layer is arranged on one side, deviating from the second substrate, of the pixel defining layer, the cathode layer and the touch electrode layer are spaced, a plurality of photo spacers are arranged between the cathode layer and the pixel defining layer, a projection of each photo spacer on the touch electrode layer falls within one light hole, and a part of the cathode layer corresponding to each photo spacer passes through the light hole and abuts against the first substrate.

12. The touch display screen according to claim 11, wherein each pixel unit is arranged adjacent to one photo spacer.

13. The touch display screen according to claim 11, wherein the pixel unit comprises a plurality of sub-pixels, and the plurality of sub-pixels surrounds the photo spacer.

14. The touch display screen according to claim 13, wherein the photo spacer and at least one sub-pixel are located on a straight line.

15. The touch display screen according to claim 13, wherein the pixel unit comprises three sub-pixels, and the three sub-pixels are located on the edge of the photo spacer respectively.

16. The touch display screen according to claim 13, wherein the pixel defining layer is provided with a plurality of pixel holes, and one sub-pixel is arranged in each pixel hole.

17. The touch display screen according to claim 11, wherein a material of the cathode layer comprises a metal film.

18. The touch display screen according to claim 11, wherein a material of the cathode layer comprises magnesium silver alloy.

19. The touch display screen according to claim 11, wherein the light hole has a T-shaped structure.

20. The touch display screen according to claim 11, wherein the light hole has a triangular structure.

* * * * *